(12) United States Patent
Lai et al.

(10) Patent No.: US 10,124,966 B2
(45) Date of Patent: Nov. 13, 2018

(54) TRANSFER TRACK STOPPER FOR PACKAGED INTEGRATED CIRCUITS

(71) Applicant: TEXAS INSTRUMENTS INCORPORATED, Dallas, TX (US)

(72) Inventors: Jonathan Meng Hon Lai, Kuala Lumpur (MY); Kai Jun Teoh, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/956,539

(22) Filed: Apr. 18, 2018

(65) Prior Publication Data

US 2018/0237231 A1  Aug. 23, 2018

Related U.S. Application Data

(63) Continuation of application No. 15/071,957, filed on Mar. 16, 2016, now Pat. No. 9,975,708.

(51) Int. Cl.
| | |
|---|---|
| *B65G 47/88* | (2006.01) |
| *B65G 47/90* | (2006.01) |
| *H05K 13/04* | (2006.01) |
| *H05K 13/02* | (2006.01) |

(52) U.S. Cl.
CPC ..... *B65G 47/8861* (2013.01); *B65G 47/8815* (2013.01); *B65G 47/90* (2013.01); *H05K 13/028* (2013.01); *H05K 13/043* (2013.01)

(58) Field of Classification Search
CPC .. B65G 11/203; B65G 25/06; B65G 47/8815; B65G 47/8861; B65G 47/8869; B65G 47/90; B65G 2205/04; H05K 13/02; H05K 13/043; H05K 13/028; H01L 21/67706; H01L 21/67736
See application file for complete search history.

(56) References Cited

U.S. PATENT DOCUMENTS

| | | | |
|---|---|---|---|
| 4,228,901 A | 10/1980 | Watzka et al. | |
| 4,730,749 A | 3/1988 | Buesing et al. | |
| 4,733,459 A | 3/1988 | Tateno | |
| 4,744,451 A | 5/1988 | Sekiguchi et al. | |
| 4,993,588 A | 2/1991 | Willberg et al. | |
| 5,636,725 A * | 6/1997 | Saito | B65G 47/145 198/383 |
| 6,032,783 A * | 3/2000 | Saito | H05K 13/022 193/44 |
| 6,074,158 A | 6/2000 | Yutaka et al. | |
| 6,132,167 A | 10/2000 | Ikeya et al. | |
| 6,152,671 A * | 11/2000 | Kaishita | H05K 13/021 198/383 |
| 6,241,461 B1 * | 6/2001 | Takahashi | B65G 27/12 198/750.1 |

(Continued)

*Primary Examiner* — Gene O Crawford
*Assistant Examiner* — Keith R Campbell
(74) *Attorney, Agent, or Firm* — Rose Alyssa Keagy; Charles A. Brill; Frank D. Cimino

(57) ABSTRACT

A packaged integrated circuit transfer track with a stopper arm that is constrained to vertical motion. A packaged integrated circuit transfer track with a cam follower that engages a cam causing a stopper arm to raise or lower vertically. A packaged integrated circuit transfer track with an actuator that engages a switch causing a motor or solenoid to raise or lower the stopper arm vertically.

10 Claims, 6 Drawing Sheets

(56) References Cited

U.S. PATENT DOCUMENTS

| | | | |
|---|---|---|---|
| 6,332,529 B1 * | 12/2001 | Kaishita | H05K 13/028 198/396 |
| 6,375,406 B1 * | 4/2002 | Takahashi | B65G 25/06 198/459.6 |
| 6,479,984 B1 | 11/2002 | Vesaruch et al. | |

* cited by examiner

TRANSFER TRACK STOPPER FOR PACKAGED INTEGRATED CIRCUITS

CROSS REFERENCE TO RELATED APPLICATION

This application is a Continuation of and claims priority to U.S. patent application Ser. No. 15/071,957 filed Mar. 16, 2016, the contents of which is herein incorporated by reference.

FIELD

This disclosure relates to the field of integrated circuits. More particularly, this disclosure relates to a transfer track for packaged integrated circuits.

BACKGROUND

Transfer tracks are used to transfer packaged integrated circuits to equipment such as integrated circuit testing equipment, integrated circuit inspection equipment, and circuit board assembly equipment.

A typical transfer track is illustrated in FIG. 1A.

The transfer track consists of a transfer track rail 100 with a track slot 102 in which packaged integrated circuits 122 such as QFN (Quad-Flat No leads) packaged integrated circuits, are placed end-to-end in a row.

A transfer track head 104 with a packaged IC slot 105 of sufficient size to receive one packaged IC 122 alternatively engages and disengages with the transfer track rail 100 during the packaged IC 122 transfer operation. A tab 106 on the transfer track head 104 mates with an opening 107 in the lead end of the transfer track rail 100 to ensure proper alignment of the packaged IC slot 105 with the transfer track slot 102 during engagement.

A stopper arm 118 with a cam 114 is attached to the transfer track rail 100 with a pivot 116. A stopper 108 attached to the upper end of the stopper arm 118 presses down on the lead packaged IC 122 at the lead end of the transfer track rail 100 to prevent it from moving when the transfer track head 104 disengages and reengages with the transfer track rail 100.

A transfer head arm 110 with a cam follower 112 is attached to the transfer head 104. As the transfer head 104 engages and disengages with the transfer track rail 100 the cam follower 112 actuates the cam 114 causing the stopper arm 118 to to clamp and unclamp the lead packaged IC 122.

The major steps in the operation of the transfer track are illustrated in FIGS. 1A through 1F.

As shown in FIG. 1A, the lead packaged IC 122 is clamped in place by the stopper 108 attached to the upper end of the stopper arm 118 when the transfer head 104 is disengaged from the transfer rail 100.

In FIG. 1B, the transfer track head 104 mates with the transfer track 100. As the transfer head 104 mates with the transfer track 100, the cam follower 112 on the transfer head arm 110 actuates the cam 114 on the stopper arm 118 causing the stopper arm 118 to pivot. The pivoting motion causes the stopper 108 to lift up and to unclamp the lead packaged IC 122.

As is illustrated in FIG. 1C the packaged ICs 112 are then advanced along the transfer track slot 102 causing the lead packaged ICs 112 to be transferred from the transfer track slot 102 on the transfer track 100 to the packaged IC slot 105 on the transfer head 104.

In FIG. 1D, the transfer head 104 now containing the lead packaged IC 122 in the packaged IC slot 105 disengages from the transfer rail 100. As the transfer head 104 disengages from the transfer rail 100, the cam follower 112 on the transfer head arm 110 separates from the cam 114 on the stopper arm 118 causing the stopper arm 118 to pivot so that the stopper 108 clamps down on the packaged IC 122 that now occupies the lead position in the transfer track slot 102.

A pick-up tip 120 then picks up the packaged IC 122 from the transfer head 104 as illustrated in FIGS. 1E and 1F.

After the packaged IC 122 is transferred to the equipment, the transfer track 100 is ready to repeat the process and to transfer the next packaged IC 122 to the equipment.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A packaged integrated circuit transfer track with a stopper arm that is constrained to vertical motion. A packaged integrated circuit transfer track with a cam follower that engages a cam causing a stopper arm to raise or lower vertically. A packaged integrated circuit transfer track with an actuator that engages a switch causing a motor or solenoid to raise or lower the stopper arm vertically.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 2A:
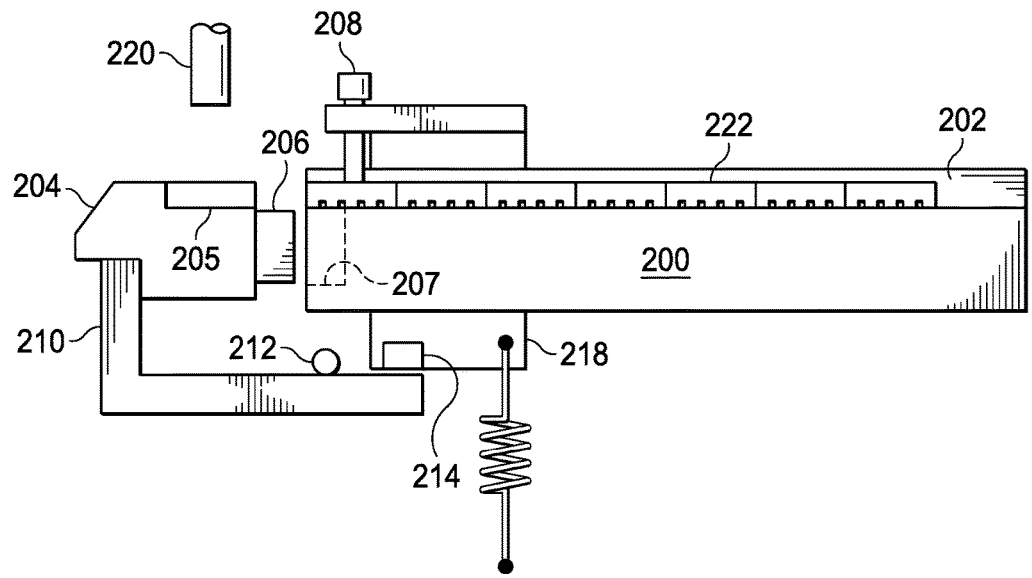
FIG. 2A-2F illustrates the operation of an embodiment packaged integrated circuit transfer track.

An embodiment transfer track with an improved stopper arm 218 is shown in FIG. 2A.

The embodiment transfer track consists of a transfer track rail 200 with a track slot 202 in which packaged integrated circuits 222 such as QFN (Quad-Flat No leads) packaged integrated circuits, are placed in a row.

A transfer track head 204 with a packaged IC slot 205 of sufficient size to receive one packaged IC 222 alternatively engages and disengages with the transfer track rail 200 during the packaged IC 212 transfer operation. A tab 206 on the transfer track head 204 mates with an opening 207 in the lead end of the transfer track rail 200 to ensure proper alignment of the packaged IC slot 205 with the transfer track slot 202 during engagement.

A stopper arm 218 attached to the transfer track rail 200 moves vertically but not horizontally. A stopper 208 attached to the upper end of the stopper arm 218 clamps down on the lead packaged IC 222 at the lead end of the transfer track rail 200 to prevent the packaged IC 222 from moving when the transfer track head 204 disengages and reengages from the transfer track rail 200. A transfer head arm 210 with a cam follower 212 is attached to the transfer head 204. The cam follower 212 may contact a cam 214 on the stopper arm 218 to mechanically move the stopper arm 218 in a vertical direction. Alternatively the cam follower 212 may be an actuator that trips a switch on the stopper arm 218 causing a motor or solenoid to move the stopper arm 218 vertically.

Figure 1A:
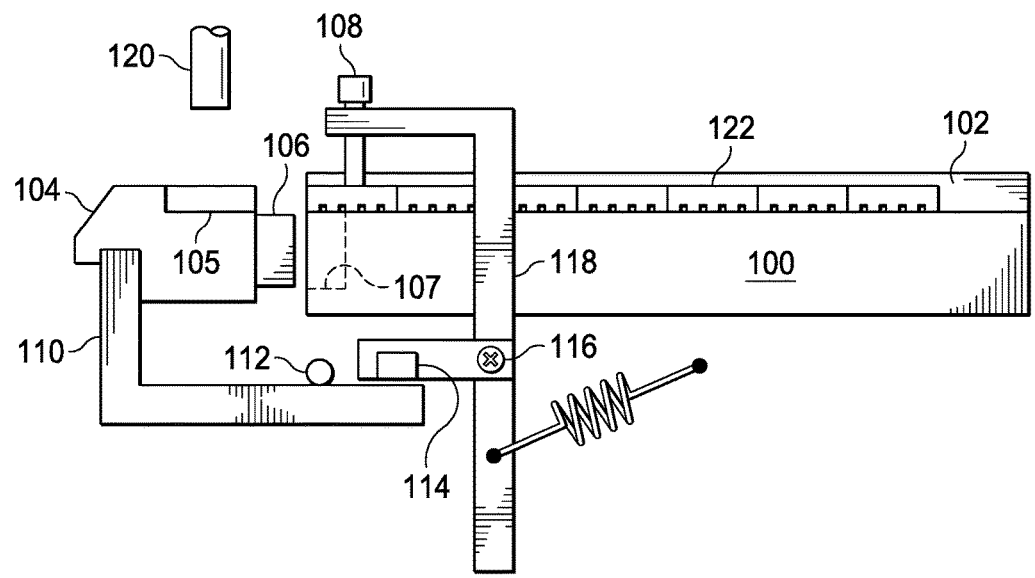
FIG. 1A-1F (Prior art) illustrates the operation of a packaged integrated circuit transfer track.
Figure 1B:
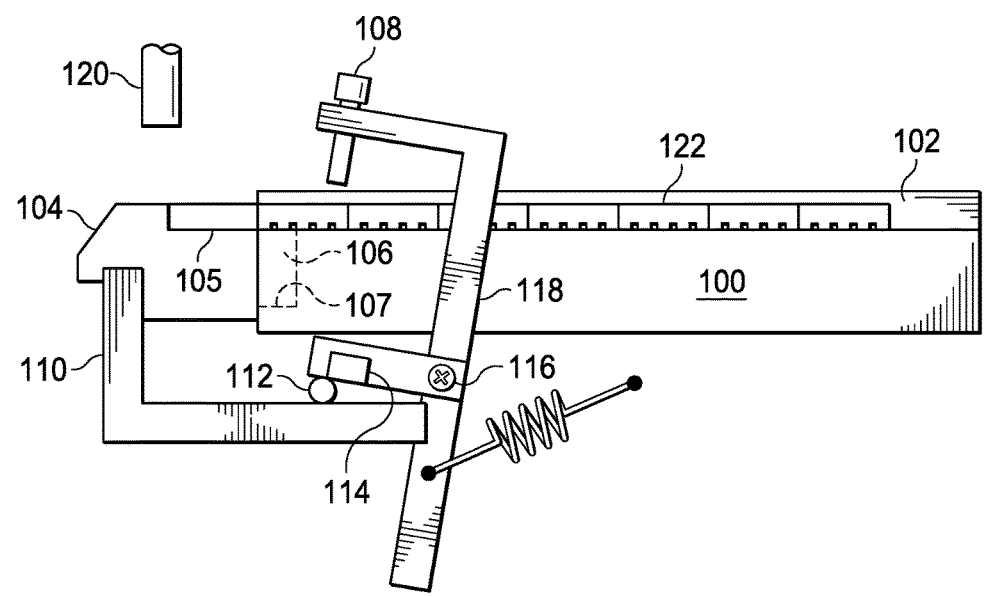
Figure 1C:
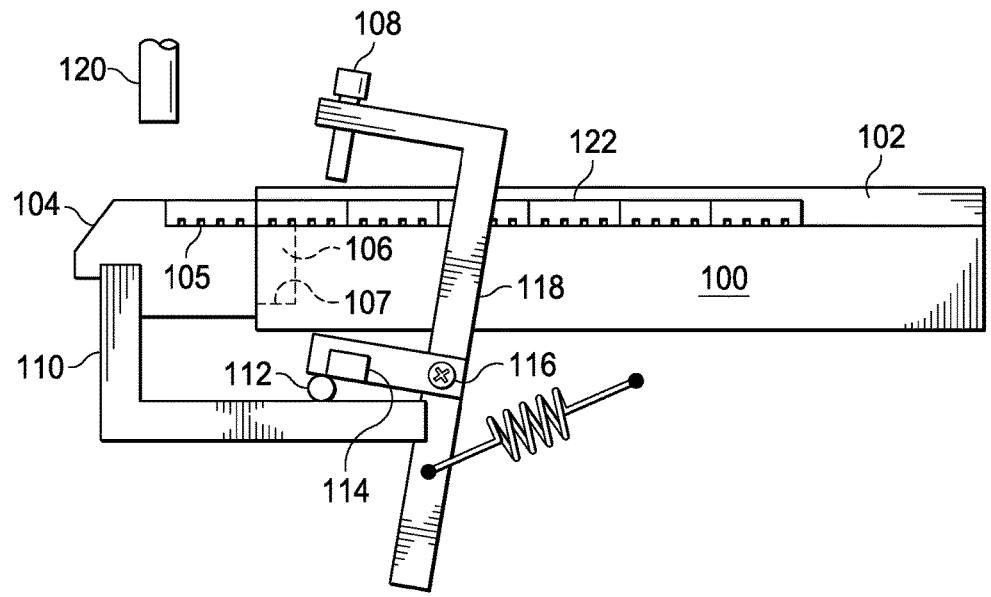
Figure 1D:
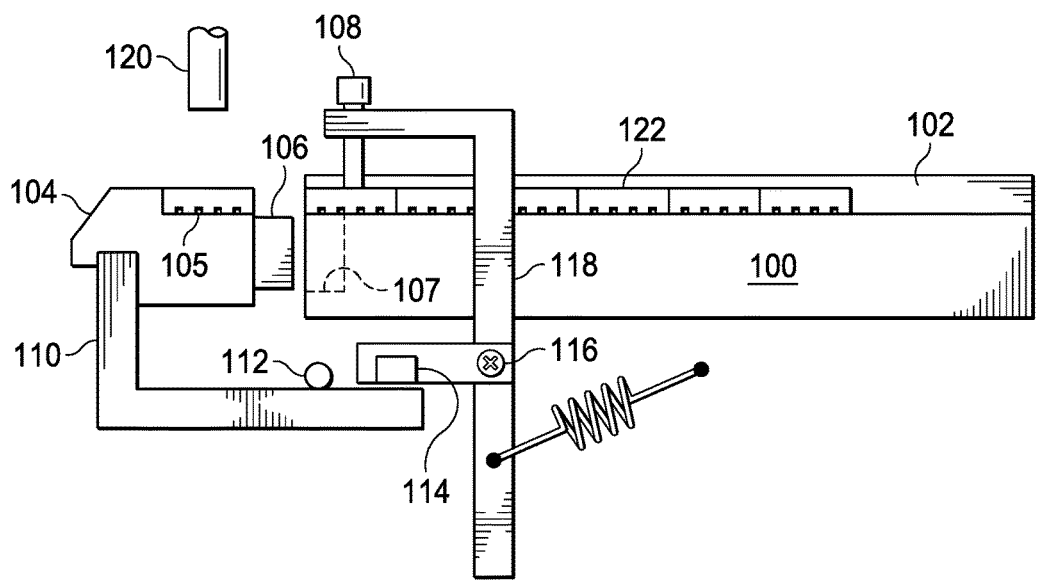
Figure 1E:
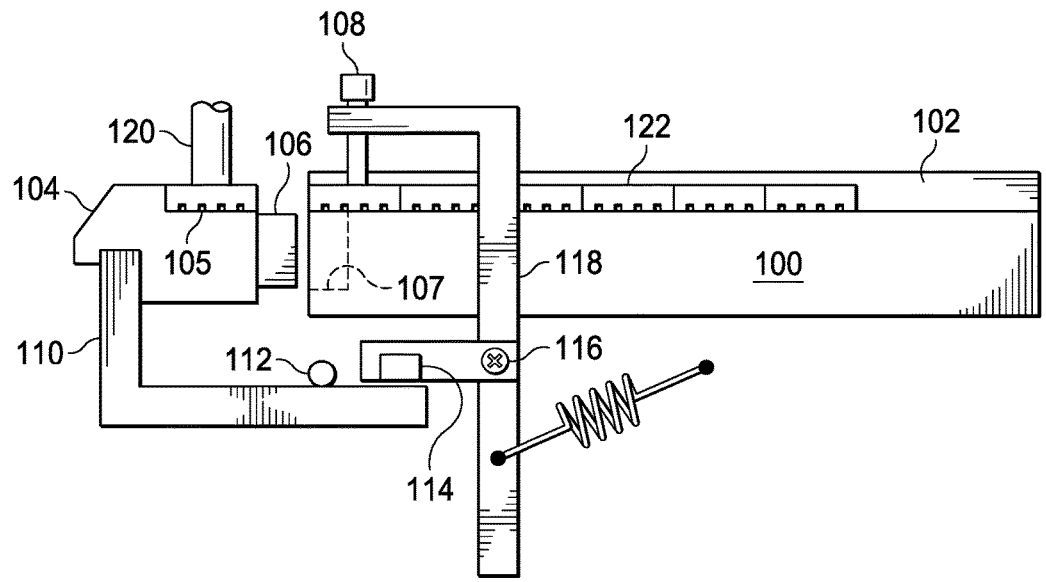
Figure 1F:
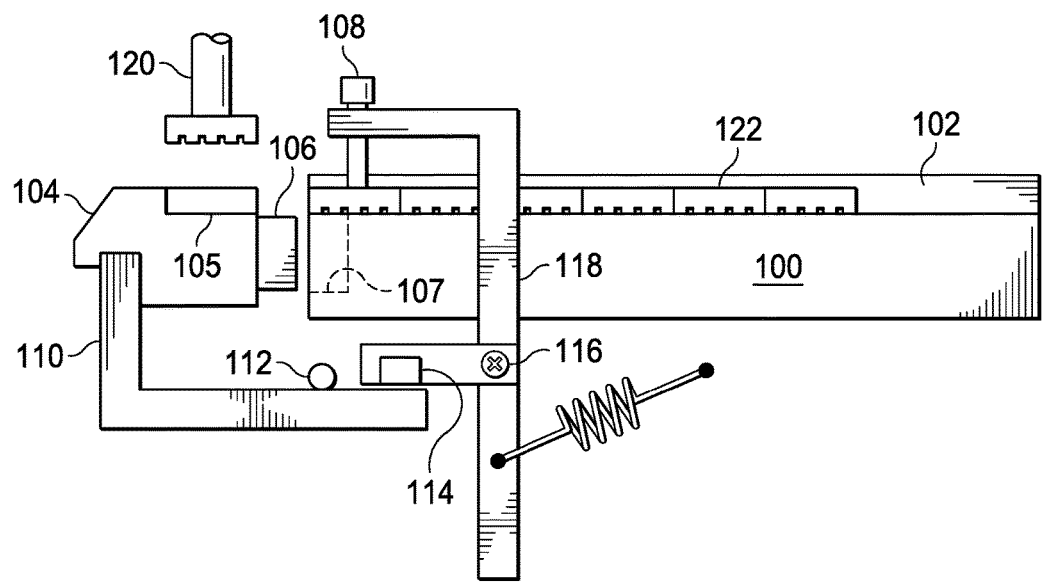

The motion of the stopper arm 218 in the embodiment transfer track is constrained to be vertical. This ensures that no horizontal force is applied to the packaged IC 222 when the stopper 208 clamps or unclamps the lead packaged IC 222. The typical stopper arm 118 (FIG. 1A) which pivots during clamping and unclamping of the lead packaged IC 122, may apply horizontal force to the lead packaged IC 122 causing it to move horizontally while the stopper 108 is applying downward pressure. This may cause the contact pads on the packaged IC to be scratched and damaged. Soldered connections to these damaged contact pads may be weak and unreliable resulting in either immediate circuit failure or circuit failure during use. One typical transfer track was found to produce over 500,000 ppm failures due to scratched contact pads.

The major steps in the operation of the embodiment transfer track is illustrated in FIGS. 2A through 2F.

As shown in FIG. 2A, the lead packaged IC 222 is clamped in place by the stopper 208 attached to the upper end of the stopper arm 218. In FIG. 2A, the transfer head 204 with its attached transfer head arm 210 is disengaged from the transfer rail 200.

Figure 2B:
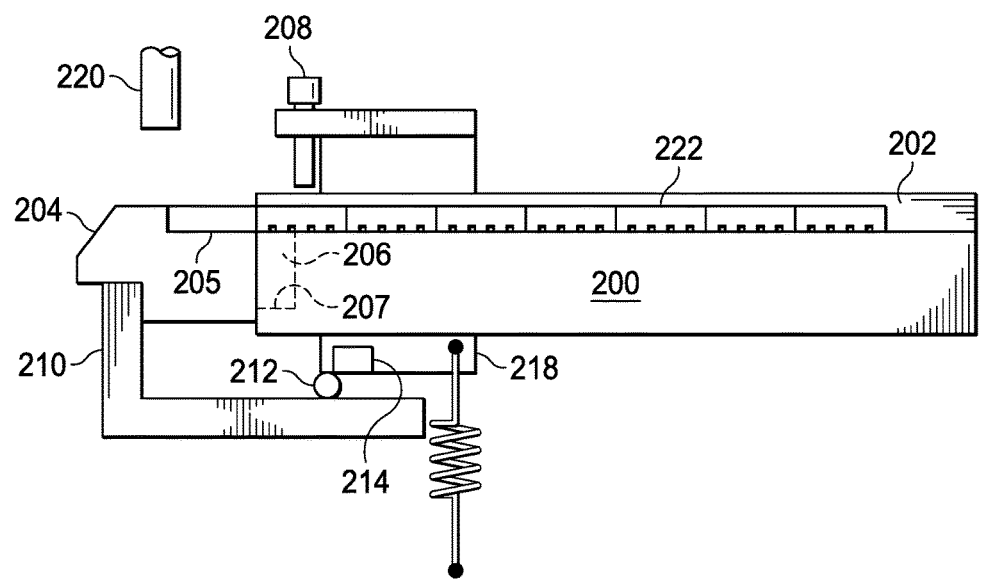

In FIG. 2B, the transfer track head 204 mates with the transfer track rail 200. As the transfer head 204 mates with the transfer track rail 200, the actuator 212 on the transfer head arm 210 contacts the cam or switch 214 on the stopper arm 218 causing the stopper arm 218 to move up vertically and to unclamp the lead packaged IC 222.

Figure 2C:
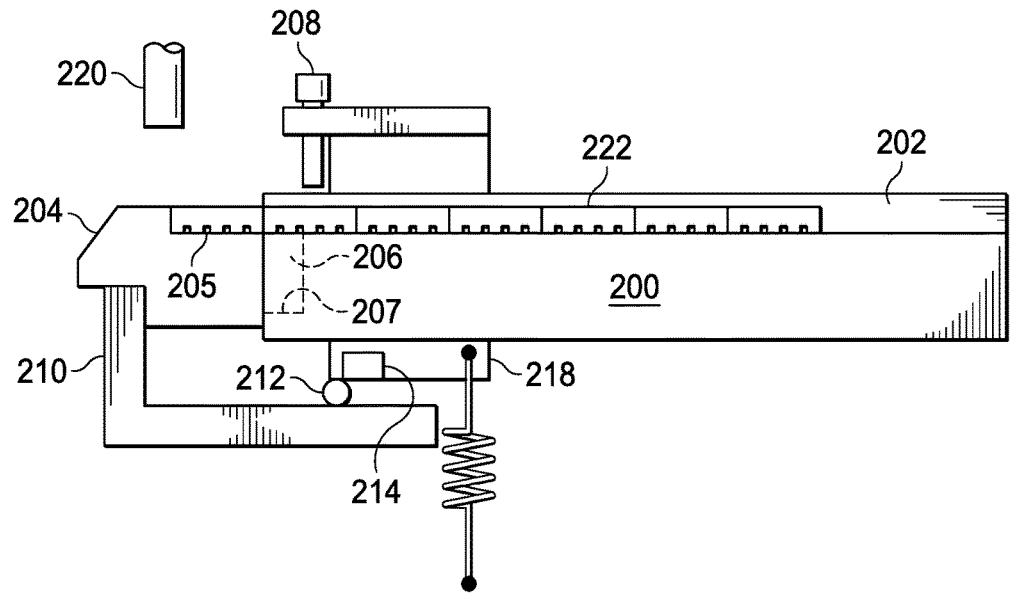

As is illustrated in FIG. 2C the packaged ICs 222 are then advanced along the transfer track slot 202 so that the lead packaged IC 222 is transferred from the transfer track slot 202 in the lead end of the transfer track rail 200 to the packaged IC slot 205 on the transfer head 204.

Figure 2D:
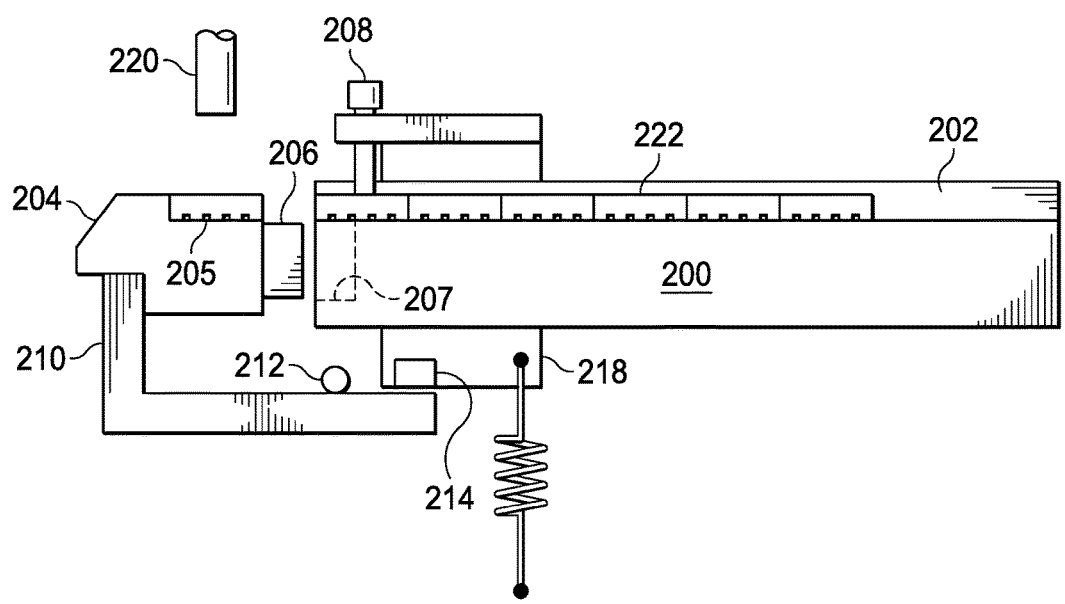

In FIG. 2D, the transfer head 204 with the lead packaged IC 222 in the packaged IC slot 205 disengages from the transfer track rail 200. As the transfer head 204 disengages from the transfer track rail 200, the actuator 212 on the transfer head arm 210 disengages from the cam or switch 214 on the stopper arm 218 causing the stopper arm 218 to lower vertically so that the stopper 208 clamps the packaged IC 222 that now occupies the lead position in the transfer track slot 202. Since the motion of the stopper arm 218 is constrained to vertical motion only, no horizontal motion of the package IC which may damage the contact pads on the packaged IC 222 occurs.

Figure 2E:
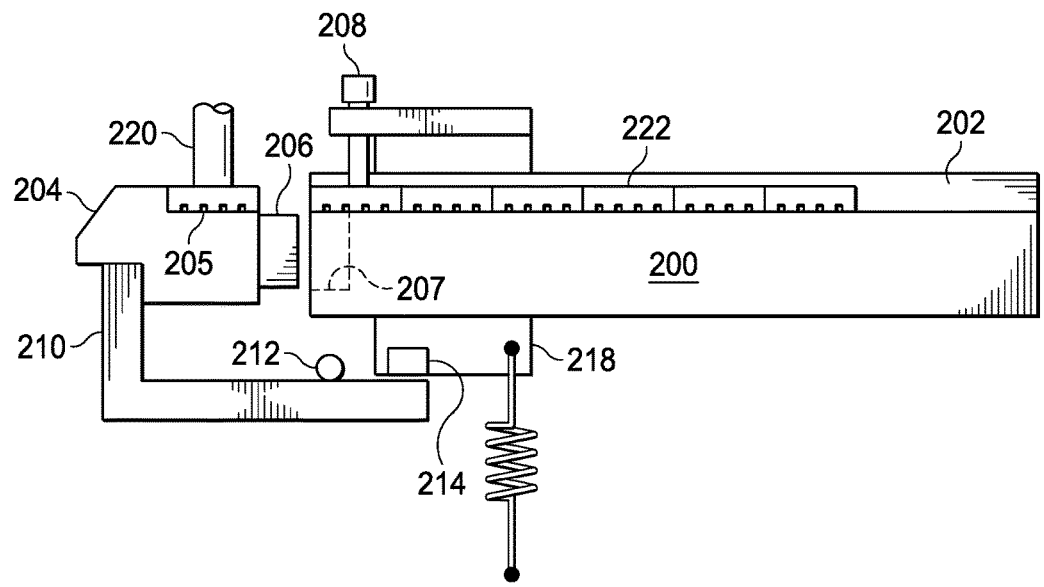
Figure 2F:
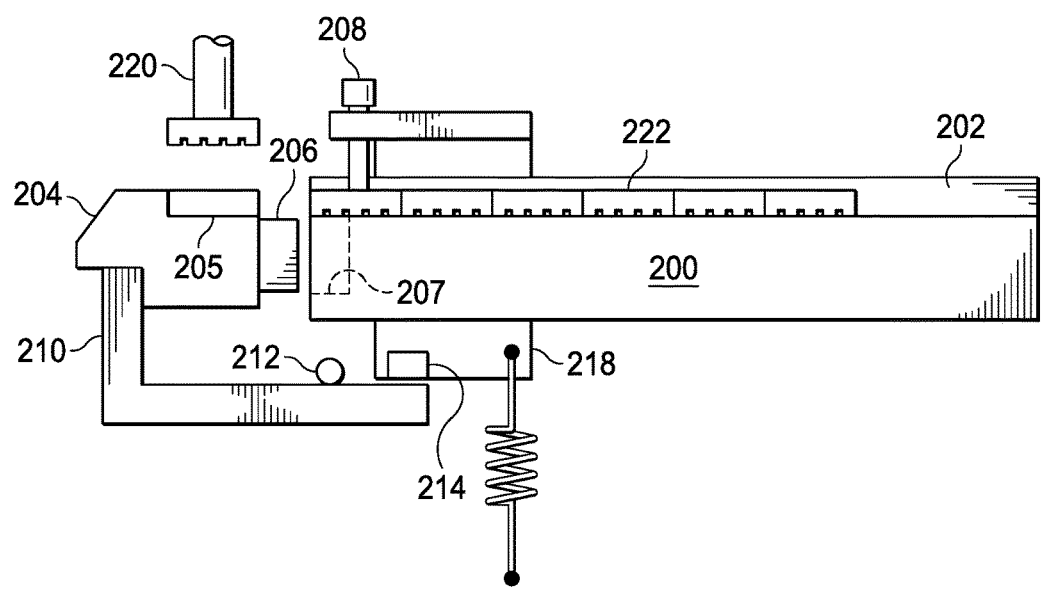

As shown in FIGS. 2E and 2F, a pick-up head 220 then picks up the packaged IC 222 from the transfer head and transfers it to the equipment.

After the packaged IC 222 is transferred to the equipment, the transfer track is ready to repeat the process and to transfer the next packaged IC 222 to the equipment.

The embodiment transfer track with vertical stopper motion provides significant advantages and cost savings. The packaged integrated circuits that are transferred using the transfer track have a high value. The integrated circuit manufacturing process that produces the IC chip is a lengthy and expensive process. The packaging process is also expensive and may double the cost of the packaged IC. Only integrated circuits that have been tested and known to be good are packaged. Scrapping integrated circuits that are known to be good and have been packaged is a very costly place to produce scrap. A typical transfer track produced over 500,000 ppm scrap due to scratched lead pads caused by horizontal scraping of the packaged IC against the transfer track slot while under pressure from the stopper. Implementation of the embodiment transfer track for a period that exceeded 6 months completely eliminated the scrap caused by stopper scratches.

Testing has shown that the vertical motion stopper can operate with 6 times lower force than the angular motion stoppers that pivot. This significantly reduces damage to the contact pads. Unlike the angular motion stoppers that pivot, the stopping down force on the packaged IC using the embodiment transfer track remains constant even after extended use.

In addition, as soon as scratched lead pads are detected, the transfer track is shut down and remains down until stopper parts are replaced and adjustments are made to eliminate the scratching. Typically the transfer track is down for 3 hours or more to replace parts and make adjustments. The embodiment transfer track reduces transfer track down time by more than 12.5% significantly reducing operating cost.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A packaged IC transfer method, comprising:
   clamping the packaged IC to a transfer track rail with a stopper while the transfer track rail is disengaged from a transfer track head;
   mating the transfer track head with the transfer track rail, the mating causing the stopper to move vertically to unclamp the packaged IC; and
   transferring the unclamped packaged IC from the transfer track rail to the transfer track head.

2. The method of claim 1 further including:
   separating the transfer track head containing the unclamped packaged IC from the transfer track rail, the separating causing the stopper to move vertically to clamp another packaged IC to the transfer track rail; and
   transferring the unclamped packaged IC from the transfer track rail to equipment.

3. The method of claim 2 where the equipment is integrated circuit testing equipment.

4. The method of claim 2 where the equipment is integrated circuit inspection equipment.

5. The method of claim 2 where the equipment is circuit board assembly equipment.

6. The method of claim 1 wherein the packaged IC that is clamped by the stopper occupies a lead position in the transfer track.

7. The method of claim 1 wherein an actuator is attached to the transfer track head and a switch is attached to the transfer track rail; wherein the actuator is in contact with the switch when the transfer track head is mated with the transfer track rail and the stopper is in an up position; and wherein the actuator is not in contact with the switch when the transfer track head is separated from the transfer track rail and the stopper is in a down position.

8. The method of claim 7 wherein the switch is coupled to a motor that raises and lowers the stopper.

9. The method of claim 7 wherein the switch is coupled to a solenoid that raises and lowers the stopper.

10. The method of claim 1 wherein a cam follower is attached to the transfer track head and a cam is attached to the transfer track rail; wherein the cam follower is in contact with the cam when the transfer track head is mated with the transfer track rail and the stopper is in an up position; and wherein the cam follower is not in contact with the cam when the transfer track head is separated from the transfer track rail and the stopper is in a down position.

* * * * *